(12) United States Patent
Ruckerbauer

(10) Patent No.: US 7,768,857 B2
(45) Date of Patent: Aug. 3, 2010

(54) METHOD OF REFRESHING DATA IN A STORAGE LOCATION BASED ON HEAT DISSIPATION LEVEL AND SYSTEM THEREOF

(75) Inventor: Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 168 days.

(21) Appl. No.: 11/949,639

(22) Filed: Dec. 3, 2007

(65) Prior Publication Data

US 2009/0141576 A1 Jun. 4, 2009

(51) Int. Cl.
*G11C 7/04* (2006.01)
(52) U.S. Cl. .................. 365/222; 365/211; 365/189.05; 365/227; 365/229; 365/228
(58) Field of Classification Search .................. 365/222, 365/227, 229, 228, 226, 189.05, 211
See application file for complete search history.

(56) References Cited

U.S. PATENT DOCUMENTS

| | | | | |
|---|---|---|---|---|
| 6,295,245 B1 * | 9/2001 | Tomita et al. | .......... | 365/189.16 |
| 6,438,057 B1 * | 8/2002 | Ruckerbauer | .............. | 365/222 |
| 6,650,586 B1 * | 11/2003 | Fanning | .............. | 365/222 |
| 6,940,773 B2 * | 9/2005 | Poechmueller | .............. | 365/222 |
| 7,039,755 B1 * | 5/2006 | Helms | .............. | 711/106 |
| 7,436,727 B2 * | 10/2008 | Jain et al. | .............. | 365/222 |
| 2005/0068829 A1 * | 3/2005 | Oh | .............. | 365/222 |
| 2007/0263425 A1 * | 11/2007 | Ruckerbauer | .............. | 365/149 |

* cited by examiner

*Primary Examiner*—Andrew Q Tran
(74) *Attorney, Agent, or Firm*—Patterson & Sheridan, L.L.P.

(57) ABSTRACT

An integrated device comprising a storage location, wherein data stored in the storage location is repeatedly refreshed with a first predetermined refresh rate during a first period of time. The first period of time provides a first predetermined duration. After the end of the first period of time, the data is repeatedly refreshed with a second predetermined refresh rate.

20 Claims, 2 Drawing Sheets

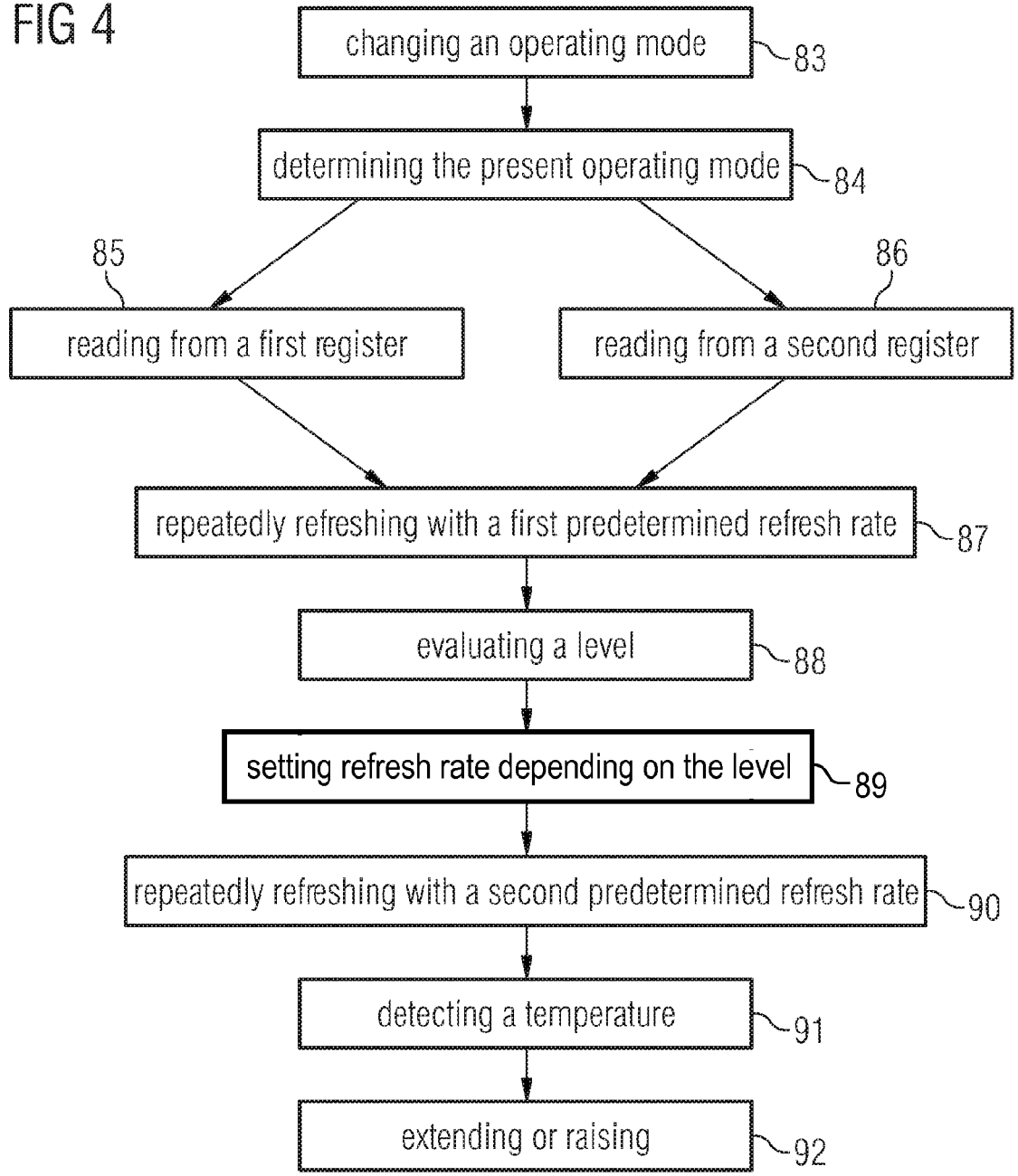

METHOD OF REFRESHING DATA IN A STORAGE LOCATION BASED ON HEAT DISSIPATION LEVEL AND SYSTEM THEREOF

BACKGROUND OF THE INVENTION

Embodiments of the invention generally relate to computer systems comprising memory.

SUMMARY OF THE INVENTION

Embodiments of the invention are generally related to computer systems comprising memory, and more specifically to refreshing the memory. An integrated device of a computer system may comprise a storage location or memory. The data stored in the memory may repeatedly be refreshed with a first predetermined refresh rate during a first period of time. The data stored in the memory may be repeatedly refreshed with a second predetermined refresh rate after the end of the first period of time.

BRIEF DESCRIPTION OF THE DRAWINGS

The features of embodiments will become clear from the following description and the accompanying drawings. It is to be noted, however, that the accompanying drawings illustrate only typical embodiments and are, therefore, not to be considered limiting of the scope of the invention. It may admit other equally effective embodiments.

FIG. 3 shows a schematic representation of an exemplary method of adapting an integrated device to an environment, according to an embodiment of the invention; and FIG. 4 shows a schematic representation of an exemplary method of operating an integrated device, according to an embodiment of the invention.

DETAILED DESCRIPTION OF THE PREFERRED EMBODIMENT

Figure 1:
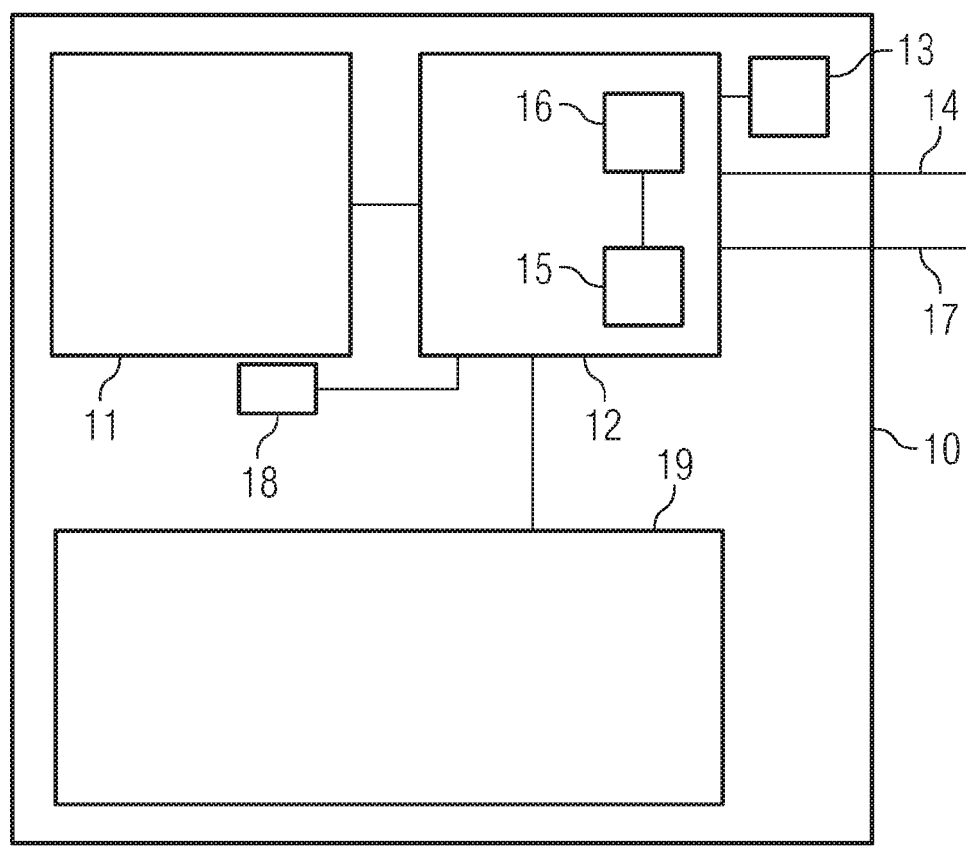
FIG. 1 shows a schematic representation of an exemplary integrated device according to an embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In some cases, embodiments of the invention may be used with multiple types of memory or with a memory which is included on a device with multiple other types of memory. Thus, an embodiment may include at least one volatile memory chip/device that performs internal refresh-cycles and one or more other types of memory chips/devices. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of nonvolatile memory.

In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

FIG. 1 shows a schematic representation of an integrated device 10 comprising a storage location 11, according to an embodiment of the invention. The integrated device 10 is, for example, a dynamic random access memory (DRAM), any other volatile memory device, a processor with cache or any other integrated device comprising a volatile storage location. The storage location 11 comprises one or several memory cells, wherein one or several bit of information can be stored in each memory cell. Data stored in the storage location need to be refreshed from time to time in order to avoid a loss of these data. The refresh rate, or refresh frequency, is the rate of refresh cycles or the inverse of the duration of one refresh cycle applied to the storage location 11.

The integrated device 10 comprises a refresh circuit 12 configured to refresh data stored in the storage location 11. The refresh circuit 12 is coupled to a register 13 configured to store at least one of a first duration or a second refresh rate. The register 13 can be part of the refresh circuit 12. Information can be written to the register 13 and can be read from the register 13 by the refresh circuit 12.

The refresh circuit 12 is coupled to a control input 14 of the integrated circuit 10. The control input 14 is configured to receive a signal indicating an operating mode of the storage location 11 or of the whole integrated circuit 10. Furthermore, the refresh circuit 12 comprises a counter 15 configured to count refresh cycles applied to the storage location 11. Transition circuitry 16 is part of the integrated device 10, is coupled to the counter 15, and is configured to cause a transition from a first refresh rate to a second refresh rate. The refresh circuit 12 is coupled to a characterization input 17 of the integrated device 10. A temperature sensor 18 detecting a temperature of the storage location 11 is coupled to the refresh circuit 12.

The storage location 11, the refresh circuit 12, the register 13 and the temperature sensor 18 need not be the only components of the integrated device 10. For example, sense amplifiers, an address decoder, signal receivers, signal drivers and other auxiliary circuitry associated to the storage location 11 may be provided in or on the integrated device 10. Furthermore, other circuitry 19 may be provided on the integrated device 10. This other circuitry 19 can, for example, be a processor core or other logic circuitry, another storage location or any other digital or analog circuitry. For example, the storage location 11 described above can be one of a number of memory blocks or memory banks. In this case, the other circuitry 19 comprises one or several other memory blocks or memory banks and respective auxiliary circuitry.

During operation, the components of the integrated device 10 consume electrical power and dissipate heat. Thereby the temperature of the integrated device and its components is raised above the ambient temperature. The level of heat dissipated by the components of the integrated device 10 and the resulting temperature of these components and of the entire integrated device 10 depend on the level of activity of each component. The level of activity is, for example, correlated with the number of read or write accesses to the storage location. When there are no accesses to the storage location 11, the storage location 11 is usually operated in a self refresh mode or another predetermined operating mode in which the refresh of data stored in the storage location 11 is controlled by the refresh circuit 12. When the storage location 11 or the entire integrated device 10 enters this predetermined operating mode, the power consumed and the heat dissipated can be reduced considerably. As a consequence, the temperature drops after entering this predetermined operating mode.

Many properties and characteristics of materials comprised in the integrated device depend on the temperature. Examples of temperature dependent properties are the resistance of an insulator, the band gap of a semi-conductor or the conductivity of a doped semi-conductor. As a consequence, leakage currents of storage capacitors and other characteristics vary with temperature. In the volatile storage location 11, the refresh rate required to avoid loss of data stored in the storage location 11 is a function of temperature, too.

Adapting the refresh rate to the maximum operating temperature of the storage location 11 minimizes the risk of data loss but causes a maximum power consumption, too. The power consumption of the integrated device 10 can be reduced by adapting the refresh rate to the temperature of the storage location 11. For this purpose, a temperature sensor can be provided detecting the temperature of the storage location 11. The refresh circuit 12 receives a temperature signal from the temperature sensor and adapts the refresh rate to the temperature detected by the temperature sensor. As an alternative, the refresh cycles are controlled by a temperature dependent oscillator of the refresh circuit 12.

In the embodiment described herein with respect to FIG. 1, the refresh circuit 12 is configured to refresh data stored in the storage location 11 with a first refresh rate within a first period of time providing a first predetermined duration and with a second refresh rate after the end of the first period of time. In particular, when the operating mode of the storage location 11 or of the entire integrated device 10 is changed, the refresh circuit 12 or any other component of the integrated device 10 determines the present operating mode. This operating mode may be an operating mode in which the refresh of data stored in the storage location 11 is controlled by external circuitry, for example, by a memory controller. When the present operating mode is a predetermined operating mode in which the integrated circuit 10 internally controls the refreshing of data stored in the storage location 11, the refresh circuit 12 or any other component of the integrated device 10 determines this operating mode. The first period of time starts with the transition to the predetermined operating mode in which the refresh is internally controlled.

For example, the first refresh rate is a maximum refresh rate adapted to a maximum temperature of the storage location 11 whereas the second period of time and the second refresh rate are adapted to the predetermined operating mode, to the power consumption, the heat dissipation and the temperature of the storage location 11 in the predetermined operating mode. In particular, when the operating mode is a typical self refresh mode of a memory device or any other operating mode with no or only very rare access to the storage location 11, the power dissipation is low. Hence the temperature of the storage location 11 is low and the refresh rate can be lower than maximum.

As already mentioned, the temperature of the storage location 11 depends on the activity or the number of accesses, on the operating mode and the resulting heat dissipation by the storage location 11. However, the temperature of the storage location 11 may also depend on the activity of and the heat dissipated by other circuitry 19 of the integrated device 10 and other heat dissipating devices in the vicinity of the integrated device 10.

Information characterizing the amount of heat dissipating by other circuitry 19 of the integrated device 10 can be provided to the refresh circuit 12 by a direct or indirect communication between the refresh circuit 12 and the other circuitry 19. As an alternative, information characterizing the heat dissipated by other circuitry 19 can be provided to the refresh circuit 12 by external circuitry, for example, by a memory controller. Information characterizing the heat dissipated by other devices in the vicinity of the integrated device 10 can be provided to the integrated device 10 by external circuitry, for example by a memory controller.

Information characterizing the level of heat dissipated by other circuitry 19 of the integrated device 10 or by other heat dissipating devices in the vicinity of the integrated device 10 can be represented by a signal indicating an operating mode to the refresh circuit 12. For example, a first predetermined operating mode is indicated to the refresh circuit when the level of heat dissipation of both other circuitry 19 of the integrated device 10 and other heat dissipating devices in the vicinity of the integrated device 10 is low, and a second predetermined operating mode is indicated to the refresh circuit 12 when the level of heat dissipated both by other circuitry 19 of the integrated device 10 and heat dissipating devices in the vicinity of the integrated device 10 is high. The refresh circuit 12 is configured to refresh data stored in the storage location 11 with a first predetermined refresh rate within a first period of time providing a first predetermined duration and with a second predetermined refresh rate after the end of the first period of time, wherein at least one of the first predetermined duration and the second refresh rate depend on the operating mode. Furthermore, the refresh circuit may be configured to permanently refresh data stored in the storage location 11 with a maximum refresh rate or for an external control of the refresh in a third predetermined operating mode.

The first predetermined duration and/or the second predetermined refresh rate can be stored in the register 13. As an alternative, these parameters are defined by the hardware of the refresh circuit 12 and the register 13 is omitted. When the parameters are stored in the register 13, they can be written to the register 13 after the manufacture of the integrated device, when the integrated device is put into operation. As an alternative, the parameters are written to the register 13 when the integrated device 10 is adapted to a new or modified environment or to modified environmental conditions.

For example, a level of heat transfer from heat dissipating devices in the vicinity of the integrated device 10 is evaluated or estimated. Then, one or several parameters characterizing at least one of the first predetermined duration and the second predetermined refresh rate and depending on the level of heat transfer are written to the register. For this purpose, the register can be a DRAM buffered by a battery, a flash memory, a programmable read only memory (PROM) or any other appropriate memory.

During operation of the integrated device, when the integrated device 10 identifies a predetermined operating mode with internal control of the refresh of data stored in the storage location 11, the refresh circuit 12 reads at least one of the first predetermined duration and the second predetermined refresh rate from the register 13. Further parameters can be stored in the register 13, too, for example, the first predetermined refresh rate, the second and predetermined duration or parameters of a refresh in a third or further operating modes in which the refresh of data stored in the storage location 11 is controlled by the refresh circuit 12.

When there are a plurality of operating modes in which the refresh circuit 12 controls the refresh of data stored in the storage location, the first predetermined duration and/or the second predetermined refresh rate are read from different parts of the register 13 depending on which predetermined operating mode is identified. As an alternative, the parameters are read from different registers depending on which predetermined operating mode is entered.

The first predetermined duration can be defined in terms of a number of refresh cycles at the first predetermined refresh rate. In this case, the counter 15 counts the refresh cycles in the first period of time. The transition circuitry 16 receives the number of refresh cycles from the counter 15 and causes a transition from the first predetermined refresh rate to the second predetermined refresh rate at the end of the first period of time. As an alternative, the transition circuitry 16 receives, from the counter 15, a signal indicating the end of the first period of time. As an alternative, the refresh circuit 12 determines the first predetermined duration in a different way. In this case, at least the counter 15 can be omitted.

As already mentioned above, the integrated device 10 described above with reference to FIG. 1 can be a memory device comprising one or several storage locations 11, a processor or any other integrated device comprising a volatile storage location with a need to refresh data stored in the storage location, and the like. When the integrated device 10 is a memory device comprising a number of storage locations 11, each of the storage locations 11 can be operated in a first operating mode while another storage location is operated in a second operating mode simultaneously. In this case, the temperature of a first storage location 11 can be primarily a function of the operating mode of the first storage location 11 but can also depend on the level of activity and the resulting level of heat dissipation of other storage locations of the same memory device. In this case, it can be advantageous to provide a first predetermined operating mode with a higher second refresh rate and a second predetermined operating mode with a lower second refresh rate. When the level of activity or the level of heat dissipation of all components of the integrated device is low, the storage locations 11 of the integrated device 10 are operated in the second predetermined operating mode. When some components of the integrated device 10 provide a high level of activity and a resulting high level of heat dissipation, the storage location 11 is operated in the first operating mode providing a higher refresh rate.

Figure 2:
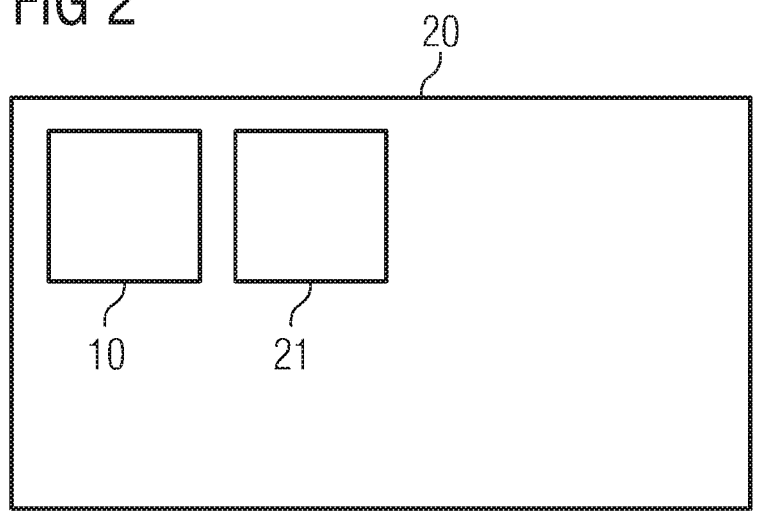
FIG. 2 shows a schematic representation of an exemplary system according to an embodiment of the invention.

FIG. 2 is a schematic representation of a system 20 with an integrated device 10 and another heat dissipating device 21. The system 20 can be a package comprising the integrated device 10 and the other heat dissipating device 21; a memory module comprising a number of memory devices; a graphics card, or video card, or any other plug-in card or component for a computer; any kind of computer; a mobile communication device; or any other system. The integrated device 10 comprised in the system 20 is an integrated device as described above with reference to FIG. 1. In the system 20, the temperature of the integrated device 10 depends on the level of activity or the level of heat dissipation of both the integrated device 10 itself and the other heat dissipating device for devices 21.

Methods of adapting an integrated device to an environment and methods of operating an integrated device will be described below with reference to FIGS. 2 and 3, respectively. Some of these methods can be applied to integrated devices as described above with reference to FIG. 1 and to systems as described above with reference to FIG. 2. In order to facilitate comprehension of these methods, the subsequent description comprises reference numerals referring to the FIGS. 1 and 2. However, both methods may be applied to other devices and other systems as well. Therefore, any reference in the subsequent description of methods to the embodiments described above with reference to FIGS. 1 and 2 is merely exemplary.

FIG. 3 is a schematic flow chart of a method of adapting an integrated device to an environment. This method starts at any time after the completion of the manufacturing process of the integrated device. The steps of the method can be conducted before or after delivery of the integrated device to a customer and before or after combining the integrated device with other devices. The steps of the method can be conducted before operating the integrated device the first time or before or during an operation of an integrated device in a new or modified environment.

For example, the steps of the method are conducted before or immediately after a memory module is assembled from a number of memory devices and a printed circuit board and before the memory module is sold to the customer or installed in a computer. As an alternative, the steps of the method are conducted during operation of the integrated device in order to adapt the device to a modified environment or to modified conditions.

The method is provided for an integrated device 10 configured to repeatedly refresh data stored in a storage location 11 of the integrate device with a first predetermined refresh rate during a first period of time and with a second predetermined refresh rate after the end of the first period of time. The first period of time is characterized by a first predetermined duration.

In a first step 71, a level of heat transfer from heat dissipating devices 21 in the vicinity of the integrated device 10 to the integrated device 10 is evaluated or estimated. This step may include determining the level of activity or the maximum level of activity and the resulting level of heat dissipation or maximum level of heat dissipation, respectively, of the neighboring device. Furthermore, the first step 71 may comprise determining the distance between the integrated device 10 and heat dissipating devices and determining any shielding or other conditions influencing the heat transfer. Evaluating or estimating the level of heat transfer may include determining any value within a continuous range or selecting one value from a predetermined number of predetermined values. The latter includes the mere evaluation whether the level of heat transfer is above or below a predetermined threshold or a number of predetermined thresholds.

In a second step 72 a parameter is written to a register 13 of the integrated device 10. The parameter written to the register 13 depends on the level of heat transfer evaluated or estimated in the first step 71. The parameter characterizes at least one of the first duration and the second refresh rate. For example, the parameter represents the first duration or the second refresh rate or an equivalent of the first duration and the second refresh rate in arbitrary units. For example, the parameter can indicate the first duration by a number of refresh cycles or by a number of clock cycles. For example, the parameter can indicate the second refresh rate in terms of a number of clock cycles per refresh cycle or in terms of a voltage to be applied to a voltage controlled oscillator.

FIG. 4 shows a schematic flow chart of a method of operating an integrated device 10 comprising a storage location 11. The method described below with reference to FIG. 4 can be applied to an integrated device which has been subject to a method as described above with reference to FIG. 3. The numbering of the steps continues the numbering of the steps of the method described above with reference to FIG. 3. However, the method described below with reference to FIG. 4 can also be applied to integrated devices which have not been subject to a method as described above with reference to FIG. 3. For example, the method can be applied to or conducted by an integrated device with inalterably fixed refreshing parameters, in particular with inalterably fixed first predetermined duration and second predetermined refresh rate.

Before the subsequently described steps are conducted, the respective integrated device is, for example, in a normal operating mode with a high level of activity and a resulting high level of heat dissipation causing a high temperature and requiring a high refresh rate of a storage location 11 of the integrated device 10.

In a third step 83 an operating mode of the storage location 11 of the integrated device 10 or of the entire integrated device 10 is changed. For example, a self-refresh mode or any other predetermined operating mode in which the integrated device 10 internally controls the refreshing of data stored in the storage location 11 is entered. This predetermined operating mode can be an operating mode with a reduced level of activity and a reduced level of heat dissipation in this storage location 11. Due to this reduced level of heat dissipation, the temperature of the storage location 11 decreases subsequently. This allows for a reduction of the refresh rate.

In a fourth step 84 the present operating mode, i.e. the operating mode entered in the third step 83, is determined. While the third step 83 may be controlled by a memory controller or any other external device, the fourth step 84 is conducted by a refresh circuit 12 or any other component of the integrated device 10. The subsequently described steps are merely conducted if the present operating mode is a predetermined operating mode or one of a number of predetermined operating modes.

In each of a fifth step 85 and an alternative sixth step 86 at least one of the first predetermined duration and a second predetermined refresh rate or one or several parameters characterizing at least one of the first predetermined duration and the second predetermined refresh rate are read from a register 13. When there is only one predetermined operating mode, there is only one step of reading instead of two or more alternative steps 85, 86. When there are a number of predetermined operating modes, for example a number of different self-refresh modes, the decision whether, in the fifth 85, the information is read from a first register or a first part of the register or, in a sixth step 86, from a second register or a second part of the register, or, in any further alternative step not displayed in FIG. 4, from any further register or any further part of the register, depends on the operating mode determined in the fourth step 84. As a consequence, at least one of the first predetermined duration and the second predetermined refresh rate depend on the determined operating mode.

In a seventh step 87, data stored in the storage location 11 are refreshed with the first predetermined refresh rate during a first period of time. The first period of time starts after the fourth step 84 or after the fifth or sixth step 85, 86 and is characterized by the first predetermined duration.

In an eighth step 88, a level of activity or a level of resulting heat dissipation of other circuitry 19 of the integrated device 10 or of other heat dissipating devices 21 of a system 20 comprising the integrated device 10 is evaluated.

Depending on the level evaluated in the eighth step 88, a second refresh rate is set in a ninth step 89. For example, the second refresh rate is set to one of a plurality of predetermined refresh rates depending on the evaluated level.

In a tenth step 90 the data stored in the storage location 11 are repeatedly refreshed with the second predetermined refresh rate during a second period of time. The second period of time starts at the end of the first predetermined period of time and can be characterized by a second predetermined duration. As an alternative, the duration of the second period of time is not predetermined but indefinite and ends when operation of the integrated device is terminated or a new operating mode is entered. When the second period of time provides a second predetermined duration, the data stored in the storage location 11 may be repeatedly refreshed with a third predetermined refresh rate after the end of the second period of time.

In an eleventh step 91, the temperature of the storage location 11 is detected, for example, by a temperature sensor 18. In a twelfth step 92, the second refresh rate is raised when the detected temperature is above a predetermined threshold. As an alternative, the eleventh step 91 and the twelfth step 92 are conducted before the end of the first period of time and instead of raising the second refresh rate, the first period of time is extended depending on the detected temperature.

A number of steps described above with reference to FIG. 4 are optional or can be conducted in a different sequence. For example, the sixth step 86 is optional when merely one predetermined operating mode exists in which the refresh of data stored in the storage location 11 is controlled by the refresh circuit. The eighth step 88 and the ninth step 89 are optional and the eleventh step and the twelfth step 92 are optional. As far as the second predetermined refresh rate is read from the register 13, the fifth step 85 and the sixth step 86 can be conducted at any time before the end of the first period of time or at the beginning of the second period of time at the latest.

As already mentioned above, the method can be applied to or conducted by an integrated device 10 without a register 13. In this case, the fifth step 85 and the sixth step 86 are omitted or modified. In particular, the first predetermined duration and/or the second predetermined refresh rate can be defined by hardware. For example, different oscillators of the refresh circuit 12 provide different refresh rates, or different capacities of different capacitors provide define different durations of the first period of time.

As an alternative, a command controlling a transition to the predetermined operating mode and a signal indicating at least one of the first predetermined duration and the second predetermined refresh rate are received. As an example, the command and the signal are received from a memory controller controlling the operating mode of the integrated device 10. In this case, the signal can be received via address lines of the integrated device.

The preceding description describes advantageous exemplary embodiments. The features disclosed therein and the claims and the drawings can, therefore, be useful for realizing various embodiments, both individually and in any combination. While the foregoing is directed to specific embodiments, other and further embodiments may be devised without departing from the basic scope, the scope being determined by the claims that follow.

What is claimed is:

1. A method of operating an integrated device comprising a storage location, the method comprising:
   reading, from a register, at least one of a predetermined duration at the beginning of a first period of time and a second predetermined refresh rate after the beginning of the first period of time, wherein at least one of the predetermined duration and the second refresh rate is set to a value depending on a level of activity or a level of heat dissipation of other circuitry in the integrated device;
   repeatedly refreshing data stored in the storage location with a first predetermined refresh rate during the first period of time wherein the first period of time has the predetermined duration; and
   repeatedly refreshing the data stored in the storage location with the second predetermined refresh rate after the end of the first period of time.

2. The method as claimed in claim 1, further comprising, entering a predetermined operating mode, wherein the first period of time begins when the predetermined operating mode is entered.

3. The method as claimed in claim 1, further comprising, entering a predetermined operating mode characterized in that the integrated device internally controls the refreshing of data stored in the storage location, wherein the first period of time begins when the predetermined operating mode is entered.

4. The method as claimed in claim 3, wherein the predetermined operating mode is a self refresh mode.

5. The method as claimed in claim 3, further comprising, receiving a command controlling a transition to the predetermined operating mode and a signal indicating at least one of the predetermined duration and the second predetermined refresh rate, before entering the predetermined operating mode.

6. The method as claimed in claim 5, wherein the signal is received via address lines of the integrated device.

7. The method as claimed in claim 1, further comprising:
   determining a present operating mode of the integrated device;
   when the integrated device is in a first predetermined operating mode, reading, from a first register, at least one of the predetermined duration at the beginning of the first period of time and the second predetermined refresh rate before a second period of time; and
   when the integrated device is in a second predetermined operating mode, reading, from a second register, at least one of the predetermined duration at the beginning of the first period of time and the second predetermined refresh rate before the second period of time.

8. The method as claimed in claim 1, further comprising:
   detecting a temperature of the integrated device; and
   extending the first period of time or raising the second refresh rate when the detected temperature is above a predetermined threshold.

9. An integrated device comprising:
   a storage location; and
   a refresh circuit coupled to the storage location, wherein the refresh circuit comprises a counter configured to count refresh cycles;
   wherein the refresh circuit is configured to refresh data stored in the storage location with a first refresh rate within a first period of time and with a second refresh rate after the end of the first period of time, the first period of time having a predetermined duration, wherein the first period of time is defined by a first predetermined number of refresh cycles, wherein the refresh circuit comprises circuitry causing a transition from the first refresh rate to the second refresh rate when the predetermined number of refresh cycles is counted by the counter; wherein the refresh circuit is further configured to set at least one of the predetermined duration and the second refresh rate depending on a level of activity or a level of heat dissipation of other circuitry.

10. The integrated device as claimed in claim 9, further comprising a register, wherein the refresh circuit is configured to read at least one of the predetermined duration and the second refresh rate from the register.

11. The integrated device as claimed in claim 9, wherein
   the integrated device Is configured for external control of refresh of data stored in the storage location in a first predetermined operating mode, and
   the refresh circuit is configured to refresh data stored in the storage location when the integrated device is in a second predetermined operating mode.

12. The integrated device as claimed in claim 11, wherein
   the refresh circuit is configured to detect a transition from any other operating mode to the second predetermined operating mode, and
   the refresh circuit is configured to start the first period of time when the transition is detected.

13. The integrated device as claimed in claim 9, wherein the integrated device is a memory device.

14. The integrated device as claimed in claim 9, further comprising a temperature sensor configured to sense a temperature of the integrated device, wherein the refresh circuit is configured to extend the first period of time when the temperature detected by the temperature sensor is above a predetermined threshold.

15. A system comprising:
   an integrated device with a storage location and a refresh circuit coupled to the storage location,
   wherein the refresh circuit is configured to refresh data stored in the storage location with a first refresh rate within a first period of time and with a second refresh rate after the end of the first period of time, the first period of time having a predetermined duration: and
   further comprising a heat dissipating device, wherein the refresh circuit comprises an input coupled to the heat dissipating device for receiving a characterization of a level of activity or a level of heat dissipation of the heat dissipating device, and the refresh circuit is configured to set at least one of the predetermined duration and the second refresh rate depending on the characterization.

16. The system as claimed in claim 15, further comprising, a register, wherein the refresh circuit is configured to read at least one of the predetermined duration and the second refresh rate from the register.

17. The system as claimed in claim 15, wherein the integrated device is configured for external control of refresh of data stored in the storage location in a first predetermined operating mode, and the refresh circuit is configured to refresh data stored in the storage location when the integrated device is in a second predetermined operating mode.

18. The system as claimed in claim 15, wherein the system is a memory module comprising a number of memory devices, and the integrated device is one of the number of memory devices.

19. The system as claimed in claim 15, wherein the system is a graphics card for a computer, comprising a number of memory devices, and the integrated device is one of the number of memory devices.

20. A method of adapting an integrated device to an environment, the method comprising:

repeatedly refreshing data stored in a storage location of the integrated device with a first predetermined refresh rate during a first period of time, the first period of time having a predetermined duration;

repeatedly refreshing data stored in the storage location of the integrated device with a second predetermined refresh rate after the end of the first period of time;

evaluating or estimating a level of heat transfer from a neighboring device to the integrated device; and depending on the level of heat transfer, writing a parameter to a register of the integrated device, the parameter characterizing at least one of the predetermined duration or the second refresh rate.

\* \* \* \* \*